(12) United States Patent
Ibbetson et al.

(10) Patent No.: US 8,957,440 B2
(45) Date of Patent: Feb. 17, 2015

(54) LIGHT EMITTING DEVICES WITH LOW PACKAGING FACTOR

(75) Inventors: James Ibbetson, Santa Barbara, CA (US); David Todd Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 28 days.

(21) Appl. No.: 13/252,448

(22) Filed: Oct. 4, 2011

(65) Prior Publication Data

US 2013/0082291 A1 Apr. 4, 2013

(51) Int. Cl.
  *H01L 29/22* (2006.01)
  *H01L 33/54* (2010.01)
  *H01L 33/22* (2010.01)
  *H01L 33/40* (2010.01)
  *H01L 33/46* (2010.01)

(52) U.S. Cl.
  CPC ............ *H01L 33/54* (2013.01); *H01L 33/22* (2013.01); *H01L 33/405* (2013.01); *H01L 33/46* (2013.01)
  USPC .................................... 257/98; 257/E33.067

(58) Field of Classification Search
  CPC .......... H01L 33/52; H01L 33/32; H01L 33/46
  USPC ..................................... 257/98–100, E33.067
  See application file for complete search history.

(56) References Cited

U.S. PATENT DOCUMENTS

| 4,946,547 | A | 8/1990 | Palmour et al. |
| 5,200,022 | A | 4/1993 | Kong et al. |
| RE34,861 | E | 2/1995 | Davis et al. |
| 5,631,475 | A * | 5/1997 | Watabe et al. ............... 257/94 |
| 5,635,733 | A * | 6/1997 | Okagawa et al. ............. 257/94 |
| 5,789,768 | A * | 8/1998 | Lee et al. .................... 257/96 |
| 6,057,562 | A * | 5/2000 | Lee et al. .................... 257/96 |
| 6,222,207 | B1 * | 4/2001 | Carter-Coman et al. ....... 257/98 |
| 6,236,382 | B1 * | 5/2001 | Kawakami et al. ........... 345/83 |
| 6,410,942 | B1 | 6/2002 | Thibeault et al. |
| 6,657,236 | B1 | 12/2003 | Thibeault et al. |
| 6,906,352 | B2 | 6/2005 | Edmond et al. |
| 6,958,497 | B2 | 10/2005 | Emerson et al. |
| 7,019,323 | B2 * | 3/2006 | Shakuda et al. ............. 257/13 |
| 7,312,474 | B2 | 12/2007 | Emerson et al. |
| 7,446,345 | B2 | 11/2008 | Emerson et al. |
| 7,692,182 | B2 | 4/2010 | Bergmann et al. |

(Continued)

OTHER PUBLICATIONS

Schubert, Light-Emitting Diodes, 2006, Cambridge University Press, 2nd Edition, pp. 94-97 (ISBN 978-0-521-86538-8).*

(Continued)

*Primary Examiner* — Matthew E Warren

(74) *Attorney, Agent, or Firm* — Myers Bigel Sibley & Sajovec, P.A.

(57) ABSTRACT

A light emitting diode die that when encapsulated within an overmolded hemispherical lens has a packaging factor less than 1.2. The light emitting diode die may include a stacked structure including a metal overlay, a composite high reflectivity mirror on the metal overlay, a transparent conductive oxide layer on the composite high reflectivity mirror, and a diode structure on the transparent conductive oxide layer. The diode structure may include a roughened surface opposite the transparent conductive oxide layer, a submount connected to the composite high reflectivity mirror and a bond metal between the submount and the metal overlay. A conductive via may extend through the composite high reflectivity mirror and electrically connect the transparent conductive oxide and the bond metal.

20 Claims, 7 Drawing Sheets

(56) References Cited

U.S. PATENT DOCUMENTS

| | | | |
|---|---|---|---|
| 7,759,689 B2 * | 7/2010 | Bour | 257/96 |
| 7,791,061 B2 | 9/2010 | Edmond et al. | |
| 7,791,101 B2 | 9/2010 | Bergmann et al. | |
| 8,158,995 B2 * | 4/2012 | Ploessl et al. | 257/98 |
| 8,253,156 B2 * | 8/2012 | Park | 257/98 |
| 2005/0247950 A1 * | 11/2005 | Nakamura et al. | 257/98 |
| 2007/0018183 A1 | 1/2007 | Denbaars et al. | |
| 2008/0157114 A1 * | 7/2008 | Basin et al. | 257/98 |
| 2009/0014744 A1 * | 1/2009 | Hsieh et al. | 257/98 |
| 2009/0173958 A1 * | 7/2009 | Chakraborty et al. | 257/98 |
| 2009/0206354 A1 * | 8/2009 | Kitano et al. | 257/98 |
| 2010/0025704 A1 * | 2/2010 | Wang et al. | 257/98 |
| 2010/0078659 A1 * | 4/2010 | Iizuka et al. | 257/94 |
| 2010/0123153 A1 * | 5/2010 | Lin et al. | 257/98 |
| 2010/0140635 A1 | 6/2010 | Ibbetson et al. | |
| 2010/0140637 A1 * | 6/2010 | Donofrio et al. | 257/98 |
| 2010/0207146 A1 * | 8/2010 | Iizuka et al. | 257/98 |
| 2010/0273280 A1 | 10/2010 | Batres et al. | |
| 2010/0327298 A1 * | 12/2010 | Konno et al. | 257/94 |
| 2011/0049546 A1 | 3/2011 | Heikman et al. | |

OTHER PUBLICATIONS

Windisch et al.; "Impact of Texture-Enhanced Transmission on High-Efficiency Surface Textured Light Emitting Diodes", Appl. Phys. Lett., vol. 79, No. 15, Oct. 2001, pp. 2316-2317.

Schnitzer et al.; 30% External Quantum Efficiency From Surface Textured, Thin Film Light Emitting Diodes, Appl. Phys. Lett, vol. 64, No. 16, Oct. 1993, pp. 2174-2176.

Windisch et al.; Light Extraction Mechanisms in High-Efficiency Surface Textured Light Emitting Diodes, IEEE Journal on Selected Topics in Quantum Electronics, vol. 8, No. 2, Mar./Apr. 2002, pp. 248-255.

Streubel et al.; High Brightness AlGaNInP Light Emitting Diodes, IEEE Journal on Selected Topics in Quantum Electronics, vol. 8, No. Mar./Apr. 2002.

\* cited by examiner

LIGHT EMITTING DEVICES WITH LOW PACKAGING FACTOR

FIELD OF THE INVENTION

This invention relates to packaged light emitting devices (LEDs) and more particularly to packaged LEDs having low packaging factor.

BACKGROUND

Light emitting diodes (LEDs) are an important class of solid state devices that convert electric energy to light and generally comprise an active layer of semiconductor material sandwiched between two oppositely doped layers. When a bias is applied across the doped layers, holes and electrons are injected into the active layer where they recombine to generate light.

There has been a great deal of recent interest in LEDs formed of Group-III nitride based material systems because of their unique combination of material characteristics including high breakdown fields, wide bandgaps (3.36 eV for GaN at room temperature), large conduction band offset, and high saturated electron drift velocity. The doped and active layers are typically formed on a substrate that can be made of different materials such as silicon (Si), silicon carbide (SiC), and sapphire ($Al_2O_3$). SiC wafers are often preferred because they have a much closer crystal lattice match to Group-III nitrides, which results in Group III nitride films of higher quality. SiC also has a very high thermal conductivity so that the total output power of Group III nitride devices on SiC is not limited by the thermal resistance of the wafer (as is the case with some devices formed on sapphire or Si). Also, the availability of semi insulating SiC wafers provides the capacity for device isolation and reduced parasitic capacitance that make commercial devices possible. SiC substrates are available from Cree, Inc., of Durham, N.C. and methods for producing them are set forth in the scientific literature as well as in U.S. Pat. No. Re. 34,861; U.S. Pat. No. 4,946,547; and U.S. Pat. No. 5,200,022.

The efficient extraction of light from LEDs is a major concern in the fabrication of high efficiency LEDs. The external quantum efficiency may be limited by total internal reflection (TIR) of light at a surface of the LED die. TIR can be caused by the large difference in the refractive index between the LED's semiconductor and surrounding ambient. LEDs with SiC substrates tend to have relatively low light extraction efficiencies because the high index of refraction of SiC (approximately 2.7) compared to the index of refraction for the surrounding material, such as epoxy (approximately 1.5). As light in such diodes tends to be emitted through the substrate, this difference results in a small escape cone from which light rays from the active area can transmit from the SiC substrate into the epoxy and ultimately escape from the LED package.

However, even if the substrate is removed, efficient light extraction from an LED die is still a concern.

SUMMARY

A light emitting diode that when encapsulated within an overmolded hemispherical lens has a packaging factor less than 1.2. In some embodiments, the light emitting diode may have a packaging factor less than 1.18 when encapsulated within an overmolded hemispherical lens. In further embodiments, the light emitting diode may have a packaging factor less than 1.16 when encapsulated within an overmolded hemispherical lens, and in still further embodiments, the light emitting diode may have a packaging factor less than 1.14 when encapsulated within an overmolded hemispherical lens.

The light emitting diode die may include a stacked structure including a metal overlay, a composite high reflectivity mirror on the metal overlay, a transparent conductive oxide layer on the composite high reflectivity mirror, and a diode structure on the transparent conductive oxide layer.

The diode structure may include a roughened surface opposite the transparent conductive oxide layer.

The light emitting diode die may further include a submount connected to the composite high reflectivity mirror and a bond metal between the submount and the metal overlay.

The light emitting diode may further include a conductive via extending through the composite high reflectivity mirror and electrically connecting the transparent conductive oxide and the bond metal.

The composite high reflectivity mirror may include a plurality of alternating stacked layers of $SiO_2$ and $Ta_2O_5$.

The composite high reflectivity mirror further comprising a layer of $Al_2O_3$ on an outermost layer of $SiO_2$ opposite the diode structure.

The transparent conductive oxide may include indium tin oxide.

A total thickness of the transparent conductive oxide, the composite high reflectivity mirror and the metal overlay may be about 0.75 microns.

The light emitting diode may include a surface emitting light emitting diode having a lambertian emission pattern.

A light emitting diode package according to some embodiments includes a submount, a light emitting diode on the submount, and an encapsulant dome on the light emitting diode. A packaging factor of the light emitting diode package may be less than 1.2.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS

Figure 1:
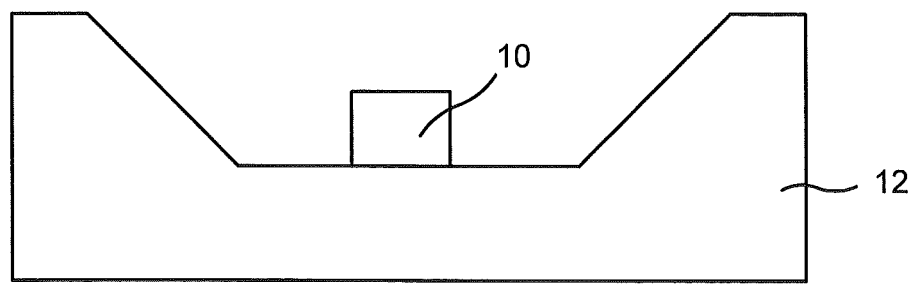
FIG. 1 illustrates an unencapsulated light emitting diode die mounted on a header.

Embodiments of the invention provide light emitting devices and packages that exhibit low packaging factors.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "between", "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

As noted above, a number of techniques have been developed to increase the light extraction efficiency of a light emitting diode. However, notwithstanding such improvements, light extraction efficiency can still be increased by packaging the light emitting die in an encapsulant, such as silicone, epoxy resin, etc. The encapsulant material has an index of refraction that is closer to the index of refraction of the LED die. Internal reflection is decreased at the interface of the LED die and the encapsulant material, which enhances the extraction of light out of the light emitting die.

Packaging factor is a metric that measures the increase of light extraction that is achieved by packaging a light emitting diode in an encapsulant. Packaging factor is defined as total power of light output by an encapsulated LED divided by total power extracted from the LED without encapsulation.

Figure 2:
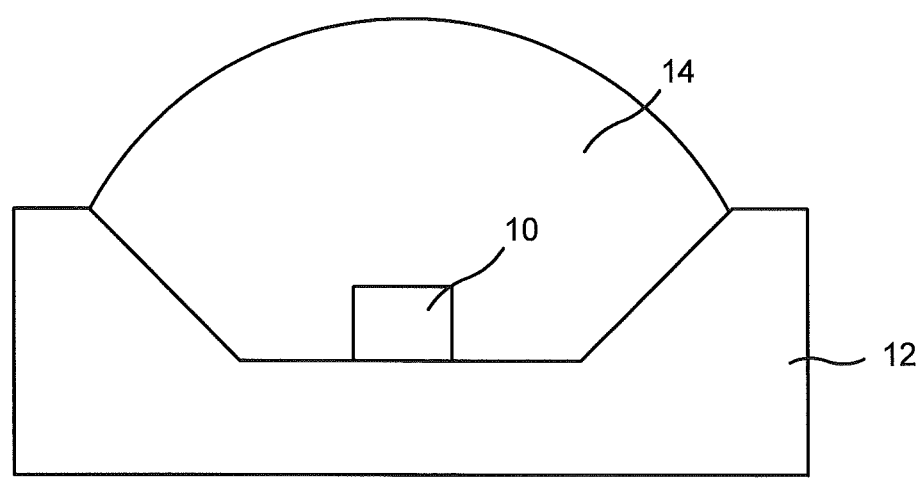
FIG. 2 illustrates an encapsulated light emitting diode die mounted on a header.

Referring to FIG. 1, a hypothetical LED die 10 is shown mounted on a reflective header 12 without encapsulation. FIG. 2 illustrates the same hypothetical LED die 10 mounted on the same reflective header 12 and covered with an encapsulant 14, such as silicone. Assuming total RF power output by the device shown in FIG. 1 (without encapsulation) at a given forward current level is 400 mW and that total radiant flux (RF) power output by the device shown in FIG. 2 (with encapsulation) at the same forward current level is 500 mW, then the packaging factor of the package shown in FIG. 2 may be said to be 1.25.

Figure 3:
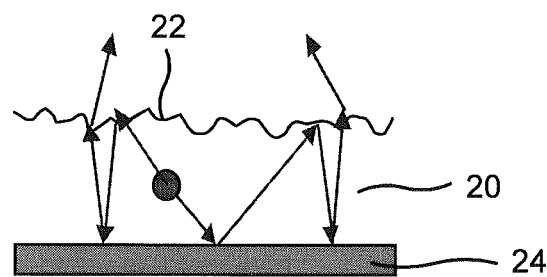
FIG. 3 illustrates an idealized model of a light emitting diode mounted on a reflective surface.
Figure 4:
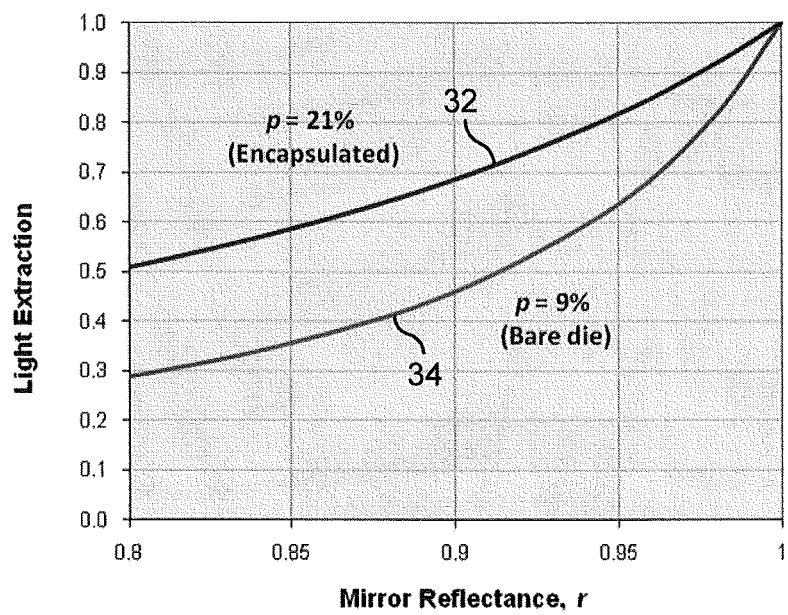
FIG. 4 is a graph of light extraction versus reflectance for the idealized LED model shown in FIG. 3.
Figure 5:
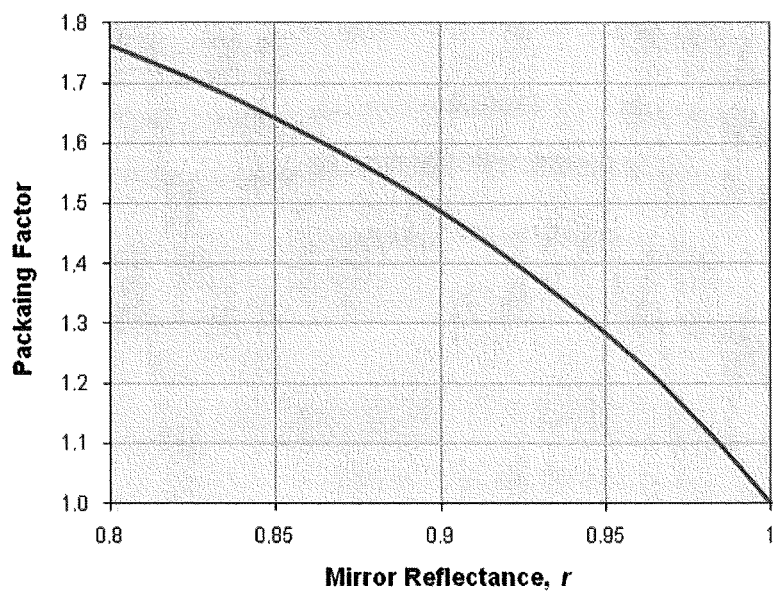
FIG. 5 is a graph of packaging factor versus reflectance for the idealized LED model shown in FIG. 3.

The effect of encapsulation on packaging factor is illustrated in FIGS. 3, 4 and 5. FIG. 3 is an idealized representation of a light emitting film 20, which may be envisioned as an LED with an internal photon source that emits light isotropically (i.e. evenly in all directions). The surface 22 of the film 20 is randomized such that a probability of light escaping when it encounters the film/air interface is p. The film 20 is mounted on a reflector 24, which has a reflectance of r (i.e., the mirror 24 reflects (r*100)% of photons that impinge the film/reflector interface).

The fraction of photons extracted after multiple passes is given by the following equation:

$$E = p(1+r)/(2(1-r(1-p))) \quad (1)$$

Assuming that the probability of escape p is 0.21 for an encapsulated film and 0.09 for a bare film, FIG. 4 shows the effect of increasing the mirror reflectance r on the light extraction from the film 20 for an encapsulated film 20 (curve 32) and a bare die (curve 34). The values of the escape probability p are based on the refractive indices of GaN (2.47), air (1.0) and silicone (1.5). FIG. 5 shows the effect of increasing the mirror reflectance r on packaging factor. The graph in FIG. 4 indicates that light extraction approaches unity as the mirror reflectance r approaches 1 (i.e. becomes a more perfect reflector), regardless of whether or not the film 20 is encapsulated. Similarly, the packaging factor approaches unity as the mirror reflectance r approaches 1. This indicates that mirror reflectance is an important factor for lowering the packaging factor of a device.

Although encapsulation can increase the amount of light that is extracted from the chip, some light may be lost within the encapsulation due to absorption. Thus, there may be some loss of wall-plug efficiency (defined as total RF output power emitted by the device divided by total electric power supplied to the device) due to encapsulation.

As light extraction from the chip increases due, for example, to structural modification of the chip, the packaging factor of the package will decrease, because more light may escape the chip regardless of whether or not an encapsulant is used. Accordingly, it may be desirable to lower the packaging factor of a particular package by increasing light extraction from the chip itself.

It will be appreciated that the packaging factor for a component can be lowered by reducing the efficiency or effectiveness of the package itself. A poor package, such as a package with absorbing surfaces or a flat lens, for example, will result in a low packaging factor by preventing light to escape.

In contrast, some embodiments achieve lower packaging factors by increasing chip light extraction regardless of whether an encapsulant is used. In other words, a low packaging factor may be achieved by increasing light extraction from the chip rather than reducing light emitted by the package.

Some embodiments provide multiple techniques that may lower the packaging factor of a device. One such technique is reducing the probability of reflection whenever a photon encounters a chip surface/air interface. This can be achieved by texturing one or more surfaces of the LED die, providing other scattering or interference features, such as photonic crystals on or in the LED die, and/or restricting angles of incidence of photons on the chip surface/air interface to within an escape cone that increases probability of extraction.

Another technique is making sure that even if a photon experiences total internal reflection (TIR) when it encounters a chip surface/air interface there is a high chance that it will not be absorbed within the LED chip before it encounters another surface/air interface. This may be achieved, for example, by reducing possible sources of absorption sites in the chip, such as by providing reflective surfaces underneath features such as contacts and bulk regions, and/or by thinning or removing a substrate to reduce bulk absorption.

Figure 6:
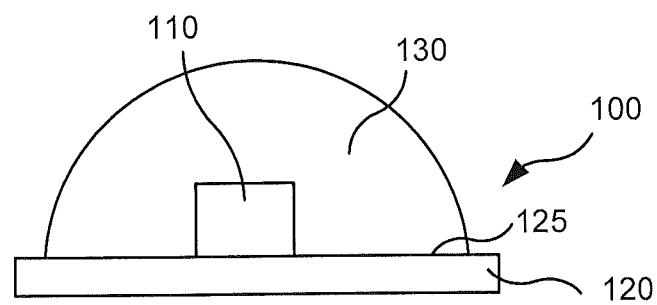
FIG. 6 illustrates a light emitting diode die mounted on a submount and encapsulated in a hemispherical dome encapsulant.

FIG. 6 illustrates an LED package structure 100 that may be used to evaluate packaging factor of a light emitting diode die. The LED package structure 100 includes a substrate 120 and an LED die 110 mounted to the substrate. A clear silicone encapsulant having an index of refraction of about 1.5 forms a hemispherical dome 130 over the die 110. The dome 130 may have a width that is at least about three times the width of the die 110.

The substrate 120 may be a metal core printed circuit board (MC-PCB) substrate, such as an insulated thermal clad MC-PCB manufactured by The Bergquist Company, Chanhassen, Minn. The substrate 120 may have a reflective surface 125 adjacent the LED die 110. For example, the surface 125 may be coated with a white soldermask coating that provides a diffuse reflector to reduce absorption of light.

Figure 7:
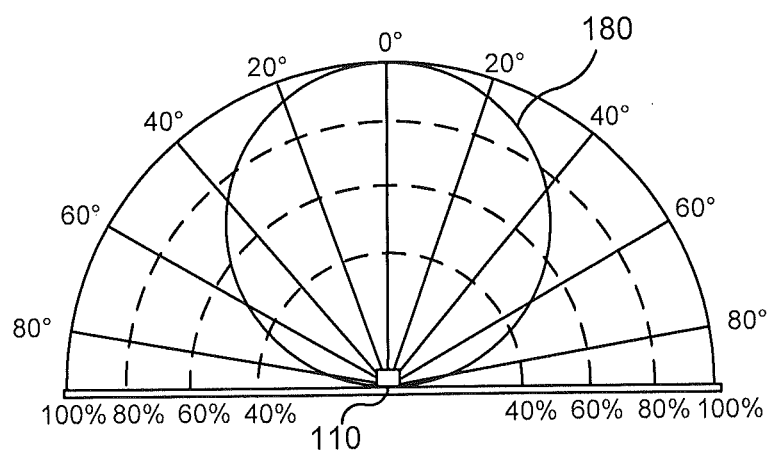
FIG. 7 illustrates a Lambertian emission profile.

The LED die 110 may be a surface emitting LED die having a Lambertian emission pattern, such as the emission pattern 180 shown in FIG. 7. In a Lambertian emission pattern, the intensity of emission is proportional to the cosine of the angle of observation and the surface normal. Thus, the emission intensity is 100% at a 0° observation angle (vertical) and 0% at a 90° observation angle (horizontal). Thus, the effect of the reflectance of the substrate 120 on the may be negligible, as most of the light emitted by the LED die 110 will not impinge upon the substrate 120.

Figure 8:
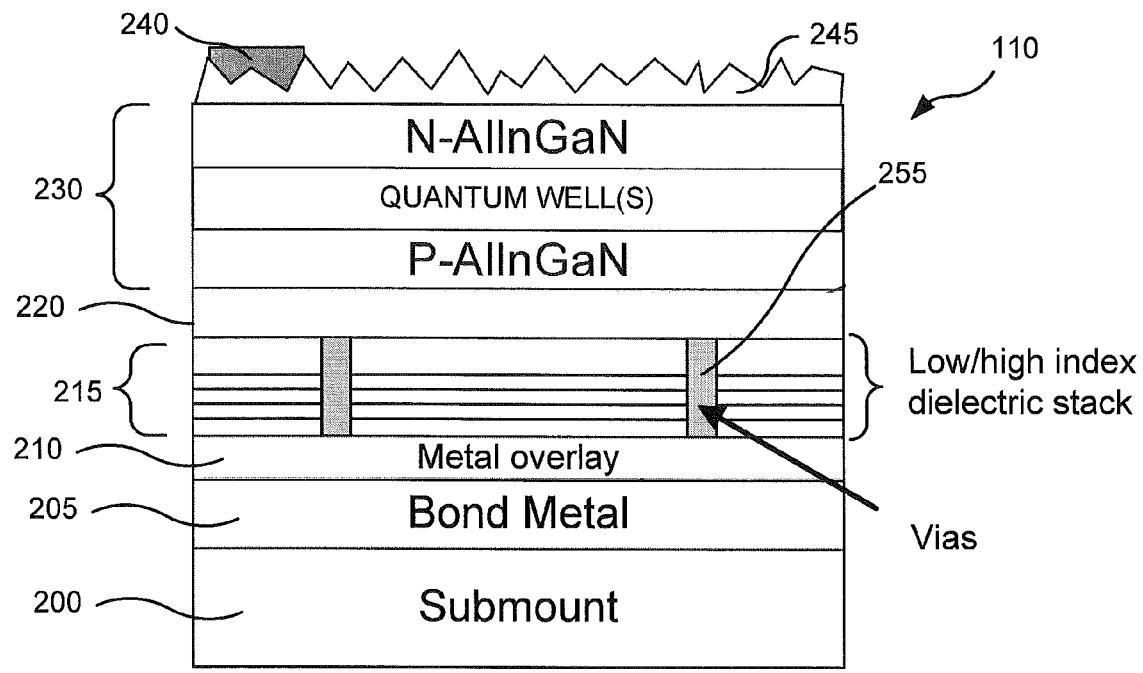
FIG. 8 illustrates an LED structure that is capable of achieving a low packaging factor when packaged as shown in FIG. 6.

FIG. 8 illustrates an LED structure 110 that is capable of achieving a low packaging factor when packaged as shown in FIG. 6. The LED structure 110 is a flip-chip vertical LED structure including a diode structure 230 that is bonded to a submount 200. The submount 200 may include a material, such as copper, that has a high thermal conductivity. The diode structure may include a GaN-based quantum well active region 230a between a p-type AlInGaN region 230b and an n-type AlInGaN region 230c. The diode structure 230 may have a layer structure as described in U.S. Pat. Nos. 7,791,101, 7,312,474, 6,958,497, 7,446,345, 7,692,182, and 6,906,352, which are assigned to Cree, Inc., the disclosures of which are incorporated herein by reference. The diode structure 230 may be configured to generate light when energized having a dominant wavelength between about 430 nm and 6000 nm.

A transparent conductive oxide layer 220 forms an ohmic contact on the p-type AlInGaN region 230b. The transparent conductive oxide 220 may, for example, include indium tin oxide (ITO) having a thickness of 50 nm.

A composite high reflectivity layer 215 is formed on the transparent conductive oxide 220. The composite high reflectivity layer 215 is a layered structure including alternating layers of oxide materials having thicknesses and indices of refraction that cause the composite high reflectivity layer 215 to be highly reflective to light generated by the diode region 230. For example, the composite high reflectivity layer 215 may have a reflectivity greater than 97% for light having a wavelength between 460 nm and 600 nm.

The composite high reflectivity layer 215 may be formed as described in U.S. Publication No. 2010/0140635 and/or U.S. Publication No. 2011/0049546, which are assigned to Cree, Inc., the disclosures of which are incorporated herein by reference.

Figure 9:
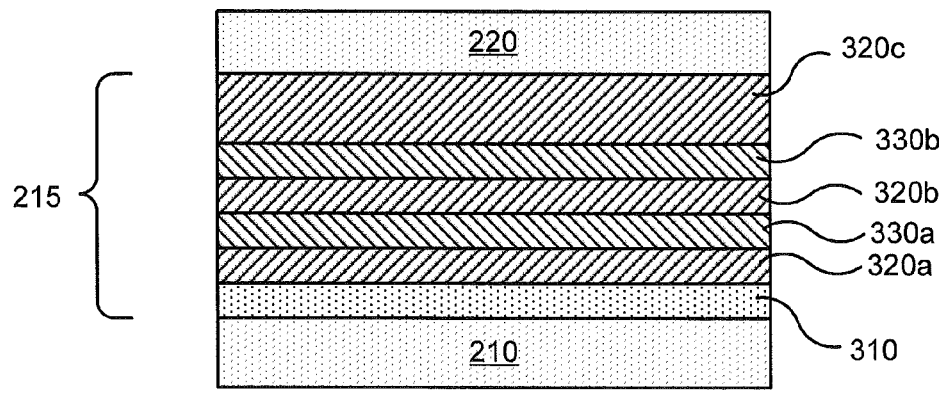
FIG. 9 illustrates a composite high reflectivity layer for use in the LED structure of FIG. 8.

In particular, the composite high reflectivity layer 215 may include a structure as illustrated in FIG. 9. As shown therein, the composite high reflectivity layer 215 may include a layer of $Al_2O_3$ 310 on which alternating stacked layers of $SiO_2$ and $Ta_2O_5$ are formed, including first, second and third SiO2 layers 320a, 320b and 320c, and first and second $Ta_2O_5$ layers 330a, 330b. Other materials, such as $TiO_2$, may be used instead or or in addition to $Ta_2O_5$.

The thicknesses of the layers is shown in Table 1.

TABLE 1

Layer Thicknesses In Composite High Reflectivity Layer

| Layer | Material | Thickness (Å) | QWOT @ 460 nm |
|---|---|---|---|
| 310 | $Al_2O_3$ | 116 | 0.18 |
| 320a | $SiO_2$ | 379 | 0.5 |
| 330a | $Ta_2O_5$ | 635 | 1.1 |
| 320b | $SiO_2$ | 1022 | 1.34 |
| 330b | $Ta_2O_5$ | 727 | 1.25 |
| 320c | $SiO_2$ | 4500 | 5.95 |

The topmost layer 320c may be relatively thick to provide a reliable viewing angle cut-off point after which the reflectivity of the composite layer is approximately 100%.

Also shown in Table 1 is the quarter wave optical thickness (QWOT) for each layer for incident light having a wavelength of 460 nm. Quarter wave optical thickness values are the optical thicknesses of the layers normalized to one quarter wavelength of 460 nm light, where the optical thickness of a material is equal to its geometric thickness multiplied by the index of refraction of light at the indicated wavelength.

A reflective metal overlay 210 is formed on the composite high reflectivity layer 215 opposite the diode region 230. The reflective metal overlay 210 may include a 200 nm layer of silver (Ag) and a 100 nm layer of titanium tungsten (TiW).

The diode structure 230, the transparent conductive oxide layer 220, the composite high reflectivity layer 215, and the metal overlay 210 may be attached to the submount 200 by means of a bond metal 205, which may, for example, include gold and/or gold/tin.

To permit electrical conduction between the submount 200 and the diode region 230, one or more conductive vias 255 may be formed through the composite high reflectivity layer 215 to electrically connect the transparent conductive oxide layer 220 to the metal overlay 210.

The thicknesses of the layers may be selected to optimize solid angle-averaged reflectance. The total thickness of the transparent conductive oxide layer 220, the composite high reflectivity layer 215, and the metal overlay 210 may be about 0.75 microns.

As discussed in U.S. Publication 2010/0140635, such a structure can have improved reflectance relative to a distributed Bragg reflector.

Figure 10:
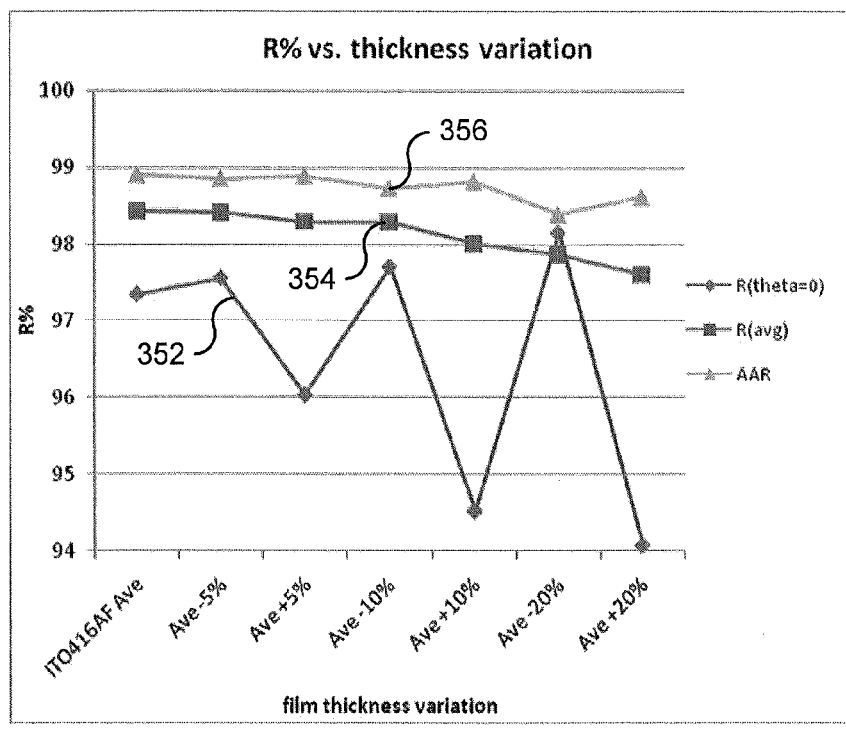
FIG. 10 is a graph of reflectance R at an incident angle of 0°, average reflectance R and angle averaged reflectivity as a function of average thickness variation of the layers in the composite high reflectivity layer of FIG. 9.

A composite high reflectivity layer 215 structure including a metal overlay 210 may have a high degree of reflectance even if there is some variability of layer thickness, as shown in FIG. 10. FIG. 10 is a graph of reflectance R at an incident angle of 0° (curve 352), average reflectance R (curve 354) and angle averaged reflectivity (curve 356) as a function of average thickness variation of the layers in the composite high reflectivity layer 215. FIG. 10 shows calculated values that illustrate that the average reflectance remains higher than 97% even for thickness variations as much as/−20%.

Referring again to FIG. 8, the diode structure 110 may include a textured upper portion 245 opposite the submount. Texturing an upper portion of the diode structure 230 may enhance light extraction from the diode structure 230, as described, for example in U.S. Pat. No. 7,791,061, U.S. Publication No. 2010/0273280 and/or U.S. Publication No. 2007/0018183, which are assigned to Cree, Inc., the disclosures of which are incorporated herein by reference.

In particular, surface texturing increases the light's escape probability by providing a varying surface that allows photons multiple opportunities to find an escape cone. Light that does not find an escape cone continues to experience total internal reflection (TIR), and reflects off the textured surface at different angles until it finds an escape cone.

In some embodiments, the upper portion 245 of the diode structure 110 may be textured by reactive ion etching the upper surface of the diode structure to produce a roughened texture.

In some embodiments, a roughened layer 245 of transparent material may be provided on the diode structure 110, as discussed in U.S. Publication No. 2007/0018183. In particular, the roughened transparent layer 245 may include a layer of transparent material, such as ZnO, ZnS, MgO, In2O3, CdS, TiO2, PbO, ZnSnO and/or indium tin oxide (ITO) that has a refractive index that is within about 0.3 of the refractive index of the material of the diode structure adjacent to the layer 245. The layer 245 may have a thickness between about 100 and 1500 nm, and may be roughed, for example, by photoelectrochemical (PEC) etching.

Other texturing techniques are discussed in Windisch et al., Impact of Texture-Enhanced Transmission on High-Efficiency Surface Textured Light Emitting Diodes, Appl. Phys. Lett., Vol. 79, No. 15, October 2001, Pgs. 2316-2317; Schnitzer et al. 30% External Quantum Efficiency From Surface Textured, Thin Film Light Emitting Diodes, Appl. Phys. Lett., Vol 64, No. 16, October 1993, Pgs. 2174-2176; Windisch et al. Light Extraction Mechanisms in High-Efficiency Surface Textured Light Emitting Diodes, IEEE Journal on Selected Topics in Quantum Electronics, Vol. 8, No. 2, March/April 2002, Pgs. 248-255; and Streubel et al. High Brightness AlGaNInP Light Emitting Diodes, IEEE Journal on Selected Topics in Quantum Electronics, Vol. 8, No. March/April 2002.

A bond pad 240 is formed on the diode structure 230 to permit connection of a bond wire for application of electrical energy to the diode structure 110. The bond pad may include gold and/or gold/tin, for example.

Figure 11:
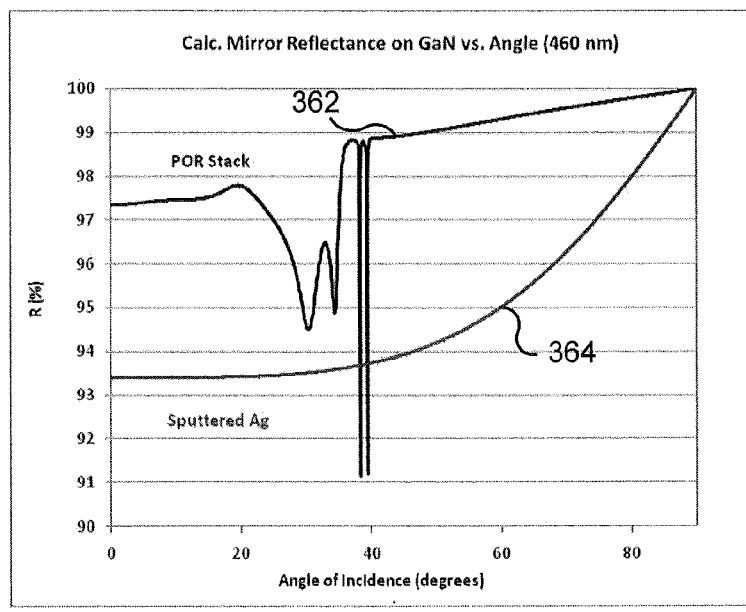
FIG. 11 is a graph of reflectance as a function of angle of incidence for light having a wavelength of 460 nm of the composite high reflectivity layer of FIG. 9 when formed on a GaN layer and sputtered silver.
Figure 12:
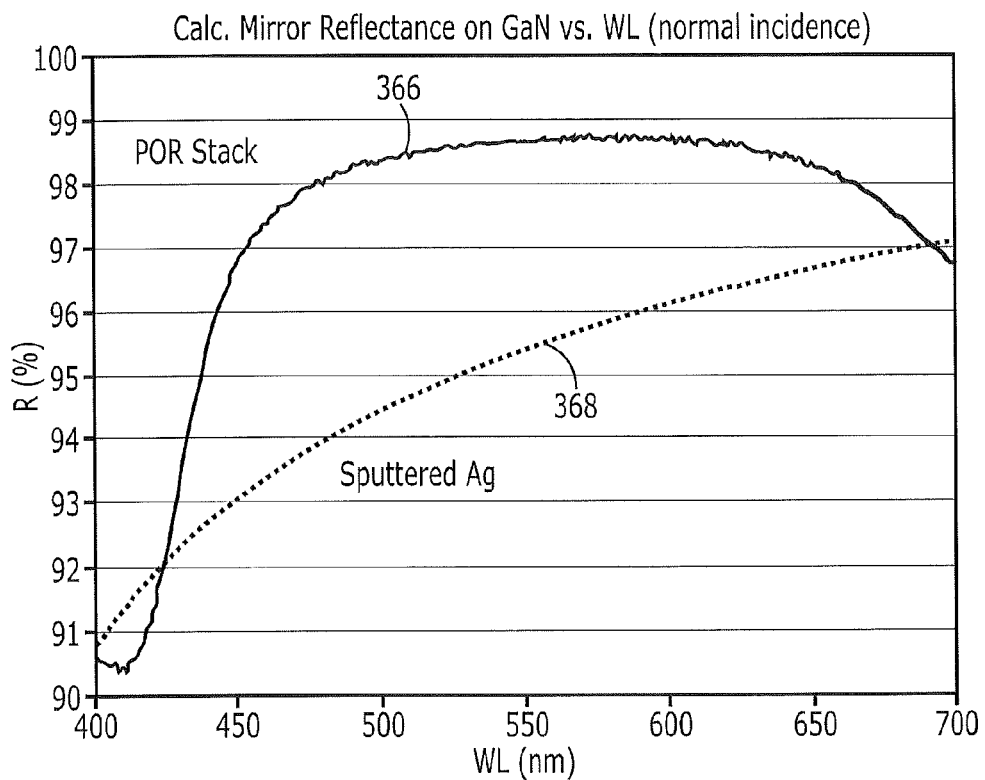
FIG. 12 is a graph of reflectance at normal incidence as a function of wavelength of the composite high reflectivity layer of FIG. 9 when formed on a GaN layer and sputtered silver.

FIG. 11 is a graph of reflectance as a function of angle of incidence for light having a wavelength of 460 nm of the composite high reflectivity layer 215 when formed on a GaN layer (curve 362) and sputtered silver (curve 364). FIG. 12 is a graph of reflectance at normal incidence as a function of wavelength of the composite high reflectivity layer 215 when formed on a GaN layer (curve 366) and sputtered silver (curve 368). These graphs indicate that the composite high reflectivity layer 215 should provide better reflectance than silver over a wide range of wavelengths and angles of incidence. However, even if some light is not reflected by the composite high reflectivity layer 215, it may be reflected back through the structure by the metal overlay 210.

Figure 13:
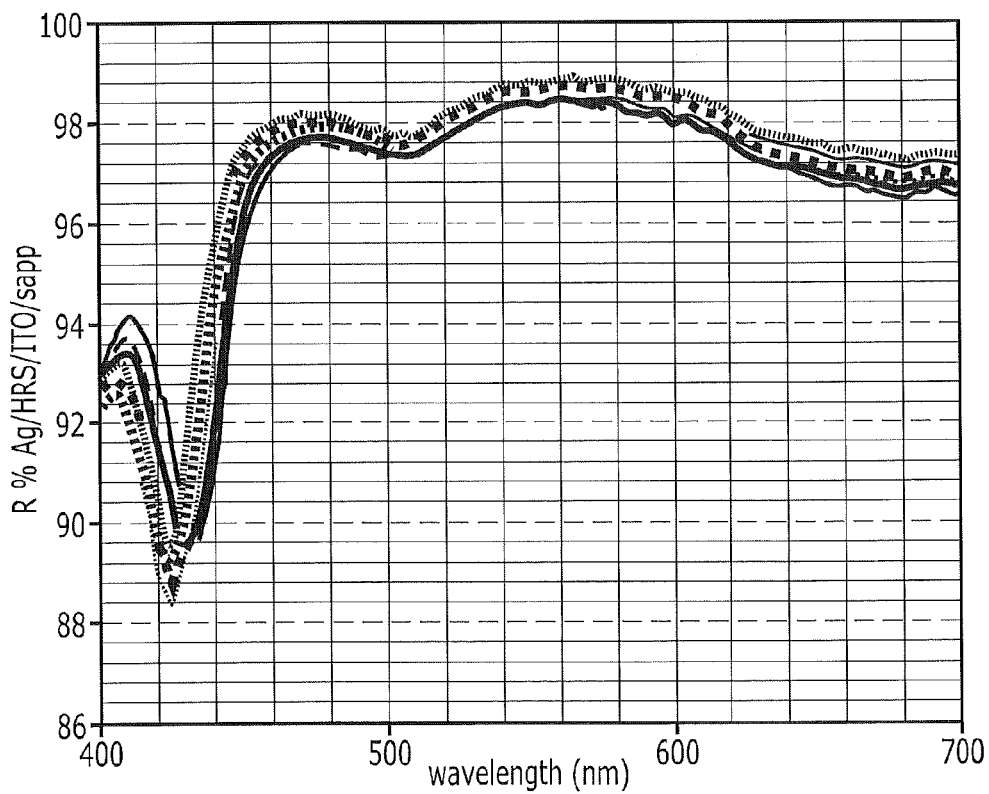
FIG. 13 is a graph of full mirror reflectance of a structure including a transparent conductive oxide layer, the composite high reflectivity layer of FIG. 9, and a reflective metal overlay as a function of wavelength for a number of test structures.

FIG. 13 is a graph of full mirror reflectance including the transparent conductive oxide layer 220, the composite high reflectivity layer 215, and the metal overlay 210 as a function of wavelength for a number of test structures. These results indicate a repeatable on-axis reflectivity of greater than 96% at 450 nm and longer. This value is slightly lower than theoretical values likely due to scattering and absorption losses, and uncertainty in optical constants used in calculations.

Other techniques for increasing light extraction may be employed. For example, U.S. Pat. No. 6,410,942, assigned to Cree, Inc. and incorporated herein by reference, discloses an LED structure that includes an array of electrically interconnected micro LEDs formed between first and second spreading layers. When a bias is applied across the spreaders, the micro LEDs emit light. Light from each of the micro LEDs reaches a surface after traveling only a short distance, thereby reducing TIR.

Similarly, U.S. Pat. No. 6,657,236, also assigned to Cree Inc. and incorporated herein by reference, discloses structures for enhancing light extraction in LEDs through the use of internal and external optical elements formed in an array. The optical elements have many different shapes, such as hemispheres and pyramids, and may be located on the surface of, or within, various layers of the LED. The elements provide surfaces from which light refracts or scatters.

Figure 14:
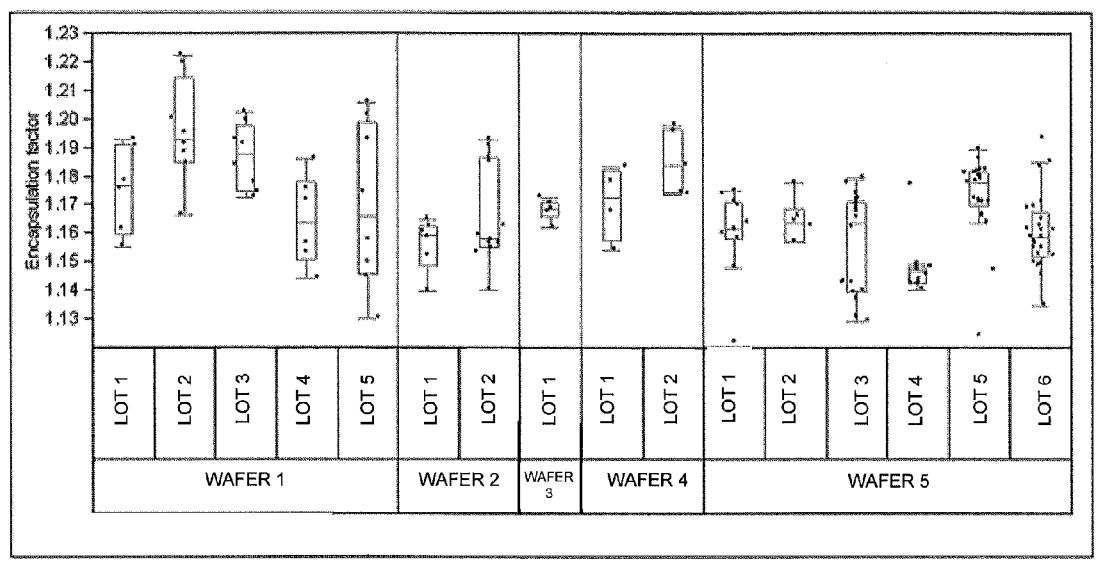
FIG. 14 illustrates packaging factor results for a number of devices having the structure shown in FIG. 8 and packaged as shown in FIG. 6.

The packaging factor of a number of devices having the structure shown in FIG. 8 was measured by measuring the radiant flux of the devices on a metal core printed circuit board (PCB) substrate in milliwatts before and after encapsulating with an over-molded hemispherical silicone lens. The results of these measurements are illustrated in FIG. 14. As shown therein, 16 lots were prepared from five different wafers. The statistically significant packaging factors ranged from a low of about 1.13 (Wafer 1, Lot 5, and Wafer 5, Lot 3) to a high of just over 1.22 (Wafer 1, Lot 2). However, all lots averaged less than 1.2, and the overall average was just over 1.166 with a standard deviation of 0.01853.

All but three lots had average packaging factors less than 1.18. A number of devices had packaging factors less than 1.6, and some devices even had packaging factors less than 1.4.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A light emitting diode die comprising:
   a metal overlay;
   a composite high reflectivity mirror comprising a plurality of alternating stacked layers of SiO2 and at least one of TiO2 and Ta2O5 on the metal overlay;
   a submount connected to the metal overlay by a bond metal;
   a transparent conductive oxide layer on the composite high reflectivity mirror;
   a diode structure on the transparent conductive oxide layer; and
   an overmolded hemispherical lens,
   wherein the metal overlay, the composite high reflectivity mirror, the transparent conductive oxide layer are arranged such that the light emitting diode die is configured to exhibit a total power of light output divided by total power extracted from the light emitting diode die without the overmolded hemispherical lens that is less than 1.2.

2. The light emitting diode die of claim 1 exhibiting a total power of light output divided by total power extracted from the light emitting diode die without the overmolded hemispherical lens that is less than 1.18.

3. The light emitting diode die of claim 1 characterized by exhibiting a total power of light output die divided by total power extracted from the light emitting diode die without the overmolded hemispherical lens that is less than 1.16.

4. The light emitting diode die of claim 1 characterized by exhibiting a total power of light output divided by total power extracted from the light emitting diode die without the overmolded hemispherical lens that is greater than 1 and less than 1.14.

5. The light emitting diode die of claim 1, wherein the diode structure comprises a roughened surface opposite the transparent conductive oxide layer comprising at least one of ZnO, ZnS, MgO, In2O3, CdS, TiO2, PbO, ZnSnO and indium tin oxide (ITO) such that when the light emitting diode die is encapsulated within the overmolded hemispherical lens, the light emitting diode die is characterized by exhibiting a total power of light output divided by total power extracted from the light emitting diode die without encapsulation that is less than 1.2.

6. The light emitting diode of claim 1, further comprising a conductive via extending through the composite high reflectivity mirror and electrically connecting the transparent conductive oxide and the bond metal.

7. The light emitting diode of claim 1, wherein the composite high reflectivity mirror comprises a plurality of alternating stacked layers of SiO2 and Ta2O5 with respective thicknesses of the alternating stacked layers selected such that the light emitting diode die is characterized by exhibiting a total power of light output divided by total power extracted from the light emitting diode die without the overmolded hemispherical lens that is less than 1.2.

8. The light emitting diode of claim 7, wherein the composite high reflectivity mirror further comprising a layer of Al2O3 on an outermost layer of SiO2 opposite the diode structure configured with a thickness such that the light emitting diode die is characterized by exhibiting a total power of light output divided by total power extracted from the light emitting diode die without the overmolded hemispherical lens that is less than 1.2.

9. The light emitting diode of claim 1, wherein the transparent conductive oxide comprises indium tin oxide with a thickness of about 50 nm.

10. The light emitting diode of claim 9, wherein a total thickness of the transparent conductive oxide, the composite high reflectivity mirror and the metal overlay is about 0.75 microns.

11. The light emitting diode of claim 1, wherein the light emitting diode comprises a surface emitting light emitting diode having a lambertian emission pattern.

12. The light emitting diode of claim 1, wherein the metal overlay comprises about a 200 nm layer of Ag and about a 100 nm layer of TiW.

13. The light emitting diode of claim 1, wherein the reflectance of the composite high reflectivity mirror is configured such that the light emitting diode die is characterized by exhibiting a total power of light output divided by total power extracted from the light emitting diode die without the encapsulant dome that is less than 1.2.

14. The light emitting diode of claim 1, wherein the overmolded hemispherical lens is a silicone lens having an index of refraction of 1.5 and forms a dome over the light emitting diode die, wherein the dome has a width at least three times a width of the light emitting diode die.

15. The light emitting diode of claim 1, wherein the diode structure comprises a GaN-based quantum well active region between a p-type AlInGaN region and an n-type AlInGaN region.

16. A light emitting diode package comprising:
    a submount;
    a light emitting diode on the submount; and
    an encapsulant dome on the light emitting diode;
    wherein the light emitting diode package comprises a metal overlay, a composite high reflectivity mirror comprising a layer of Al2O3 on an outermost layer of SiO2 opposite the light emitting diode and a transparent conductive oxide layer with respective thicknesses selected such that the light emitting diode die is configured to exhibit a total power of light output divided by total power extracted from the light emitting diode without the encapsulant dome that is less than 1.2.

17. A light emitting diode die comprising:
    a submount;

a metal overlay connected to the submount comprising at least one of a layer of silver and a layer of tin, wherein the metal overlay is attached to the submount by a bond metal of at least one of gold and tin;

a composite high reflectivity mirror on the metal overlay comprising:

a plurality of alternating stacked layers of SiO2 and at least one of TiO2 and Ta2O5, wherein the plurality of alternating stacked layers have different thicknesses; and a layer of Al2O3 on an outermost layer of SiO2 opposite the diode structure;

a transparent conductive oxide layer on the composite high reflectivity mirror;

a diode structure comprising a GaN-based quantum well active region between a p-type AlInGaN region and an n-type AlInGaN region on the transparent conductive oxide layer; and an overmolded hemispherical lens over at least the composite high reflectivity mirror and the diode structure, wherein the Al2O3 layer, the layers of SiO2 and the layers of the at least one of Ta2O5 and TiO2 are configured with respective thicknesses to reflect light from the diode structure having a wavelength between 460 nm and 600 nm in an amount and pattern such that the overmolded hemispherical lens increases a total power of light output from the light emitting diode die by less than 20%.

18. The light emitting diode die of claim 17, wherein the outermost layer of SiO2 is a first SiO2 layer, and wherein the composite high reflectivity mirror further comprises:

a first at least one of Ta2O5 and TiO2 layer on the first SiO2 layer and having a thickness less than the first SiO2 layer;

a second SiO2 layer having a thickness greater than the first at east one of Ta2O5 and TiO2 layer;

a second at least one of Ta2O5 and TiO2 layer having a thickness less than the first at least one of Ta2O5 and TiO2 layer; and a third SiO2 layer having a thickness less than the second at least one of Ta2O5 and TiO2 layer, wherein the Al2O3 layer has a thickness less than the third SiO2 layer.

19. The light emitting diode die of claim 18, wherein a total thickness of the transparent conductive oxide, the composite high reflectivity mirror and the metal overlay is about 0.75 microns.

20. The light emitting diode die of claim 19, wherein the first SiO2 layer has a total thickness of about 4500 Angstroms.

* * * * *